(12) United States Patent
Lee et al.

(10) Patent No.: US 7,209,333 B2
(45) Date of Patent: Apr. 24, 2007

(54) APPARATUS AND METHOD FOR OVER-VOLTAGE, UNDER-VOLTAGE AND OVER-CURRENT STRESS PROTECTION FOR TRANSCEIVER INPUT AND OUTPUT CIRCUITRY

(75) Inventors: Wee Teck Lee, Singapore (SG); Tu Yun, Irvine, CA (US); Tian Hwee Teo, Singapore (SG)

(73) Assignee: Broadcom Corporation, Irvine, CA (US)

( * ) Notice: Subject to any disclaimer, the term of this patent is extended or adjusted under 35 U.S.C. 154(b) by 238 days.

(21) Appl. No.: 10/787,937

(22) Filed: Feb. 27, 2004

(65) Prior Publication Data

US 2005/0190516 A1    Sep. 1, 2005

(51) Int. Cl.
*H02H 3/20* (2006.01)
*H03L 5/00* (2006.01)

(52) U.S. Cl. .................................... 361/90; 327/333

(58) Field of Classification Search ................ 361/90, 361/58; 327/319, 333
See application file for complete search history.

(56) References Cited

U.S. PATENT DOCUMENTS

| | | | | |
|---|---|---|---|---|
| 3,562,547 A | * | 2/1971 | Brode et al. | 361/1 |
| 3,596,137 A | * | 7/1971 | Kirsch | 361/76 |
| 4,739,437 A | * | 4/1988 | Morgan | 361/88 |
| 5,654,862 A | * | 8/1997 | Worley et al. | 361/111 |
| 6,212,050 B1 | * | 4/2001 | Haider | 361/86 |
| 6,426,854 B1 | * | 7/2002 | Allen | 361/56 |
| 6,504,418 B1 | * | 1/2003 | Coughlin, Jr. | 327/319 |

OTHER PUBLICATIONS

Pelgrom, M., et al., "A 3/5 V Compatible I/O Buffer," IEEE Journal of Solid-State Circuits, vol. 30, No. 7, pp. 823-825 (Jul. 1995).
Takahashi, M., et al., "3.3V-5V Compatible I/O Circuit without Thick Gate Oxide," IEEE 1992 Custom Integrated Circuits Conference, 4 pages.

* cited by examiner

*Primary Examiner*—Stephen W. Jackson
*Assistant Examiner*—Scott Bauer
(74) *Attorney, Agent, or Firm*—Sterne, Kessler, Goldstein & Fox PLLC

(57) ABSTRACT

A circuit for protection of a transceiver input includes an input transistor and a first resistor connected between the drain of the input transistor and an input node. A plurality of reverse-biased diodes connected between a supply voltage and the input node. An output node is connected to the source of the input transistor. A first forward-biased diode connected between the power supply and the plurality of reverse-biased transistors. A second forward-biased diode and a second resistor are connected between the first forward biased transistor and the gate of the input transistor. A pre-driver circuit includes first and second transistors forming a differential pair and driven by a differential input voltage. A third transistor is connected between sources of the first and second transistors and ground. First and second resistors are connected to drains of the first and second transistors, respectively. A fourth transistor is connected between a power supply voltage and the first and second resistors. Fifth and a sixth transistors are connected in series between the power supply voltage and the first and second resistors, wherein a node between the fifth and second transistors is connected to a gate of the fourth transistor.

11 Claims, 11 Drawing Sheets

APPARATUS AND METHOD FOR OVER-VOLTAGE, UNDER-VOLTAGE AND OVER-CURRENT STRESS PROTECTION FOR TRANSCEIVER INPUT AND OUTPUT CIRCUITRY

BACKGROUND OF THE INVENTION

1. Field of the Invention

The present invention relates to method and apparatus for protecting transistors used in chip interface circuits, and more particularly, to the protection of transistors used in CMOS transceiver receive and transmit circuitry.

2. Related Art

In modern submicron CMOS processes, minimum transistor dimensions have progressively become smaller over the years. This allows a faster operation, as well as the ability to integrate more functions on a chip. Transistor supply voltages have also been reduced, to maintain acceptable reliability of sub-micron transistors. However, there are still voltage level standards external to the chip that operate at higher voltages. Many legacy systems still work on 5V and 3.3V, although on-chip circuitry is required to work at 1.2V or 2.5V. The interface between the internal chip transistors and the external circuitry that operate at higher voltages is often a problem due to the need to ensure that the internal chip transistors at the interface do not fail due to the higher voltages.

Also, in certain wired communication standards, there is capability to make physical 'hot pluggable' connections. The reliability requirements for these interfaces specify a certain over-voltage and under-voltage limit that the devices there can tolerate. If these devices are implemented using CMOS transistors, they are subject to various failure mechanisms when a larger-than-foundry-specified maximum voltage is applied. One such failure mechanism is Time Dependent Dielectric Breakdown (TDDB), where, if a large voltage is applied at a gate of a CMOS device, the insulating properties of the silicon dioxide in the CMOS gate wear out, leading to a formation of a conducting path between the gate and the substrate. This then affects the gate-controlled conductivity properties of the transistor, causing circuit failure.

Another failure mechanism is hot carrier damage, where a transistor that is turned on is subjected to a drain-to-source voltage that is larger than the specified maximum. This occurs when a large electric field in the pinched off region causes channel carriers to collide with crystal atoms and to produce electron-hole pairs. These electrons can be scattered toward the gate oxide interface, degrading transistor transconductance.

A common solution to the problem of protecting input and output devices is to put external diode clamps on these inputs or outputs. When an overvoltage condition occurs, these diodes turn on and provide a high conductance current path which is able to clamp the voltage typically to $V_{DD}+V_d$ where $V_{DD}$ is the supply voltage and $V_d$ is the diode threshold voltage. However, this form of protection requires additional external diodes, which increases cost and introduces capacitive parastitics that can degrade high frequency operation. Also, this solution does not solve the problem of interfacing to 5V or 3V systems when the internal chip circuitry is operating at, for example, 2.5V.

There are conventional approaches that address the 3V to 5V interface problem. One such scheme is described in Takahashi et al., *3.3V–5V Compatible I/O Circuit Without Thick Gate Oxide*, IEEE 1992 Custom Integrated Circuit Conference. This scheme requires additional technology processing steps to create an intrinsic type PMOS and depletion type PMOS transistors. Pelgrom et al., *A 3/5 V Compatible I/O Buffer*, IEEE Journal of Solid State Circuits, Vol. 30, No. 7, July 1995, describe circuit techniques that are more suited for output drivers of the complimentary CMOS push-pull type, and not for high frequency output drivers of the current steering type. It is also more suited for low frequency operation as large cascode protection circuits are needed. Also, it does not have a protection scheme for undervoltage stress conditions.

In the case of the high speed serial transmitter outputs, a current steering circuit with resistive termination is typically used as the output driver. This current steering circuit is driven by a pre-driver which is conventionally a differential pair voltage buffer, also known as a current mode logic (CML) buffer. A conventional steering circuit 102 and a CML pre-driver 101 are shown in FIG. 1.

Referring to FIG. 1, the operation of the circuit is as follows: when a large differential input voltage is applied at Vip and Vin, a differential transistor pair of M101 and M102 steers a current $I_S$ from current source transistor M106 to either resistor R119 or R120, depending on the polarity of Vip and Vin. The steered current $I_S$ determines the output voltages of the pre-driver 101 at nodes Pre_von and Pre_vop.

The voltages at Pre_von and Pre_vop bias an input differential pair of PMOS transistors M120 and M121. If Pre_vop is high (at $V_{DDP}$) and Pre_von is low (at $V_{DDP}-IxR$), the transistor M121 will turn on, and current from M126 will flow into resistor R103 and build up a voltage at outp. Note that $V_{DDP}$ in FIG. 1 refers to 2.5V and $V_{DDO}$ refers to 3.3V.

Note that the voltage supply of the pre-driver 101 could have been connected to $V_{DDO}$ instead of $V_{DDP}$, but because the inputs Vip and Vin are driven to 0V at times, this would have caused a gate-to-drain voltage at transistors M101 and M102 of 3.3V.

The conventional output stage driver of FIG. 1 suffers from several disadvantages:

In the event of a 5V being shorted to outp, when Pre_von is $V_{DDP}-IxR$, the voltage across the gate and source of transistor M321 is $5V-(V_{DDP}-IxR)=3.9V$, which exceeds the typical specification for maximum gate to source voltage. In this example $V_{DDP}=2.5V$ and $IxR=1.4V$.

It is possible, due to power supply start up sequencing, or due to different voltage regulator start up times on the application board where the chip is being used, that certain supply voltages may be available sooner than others. For example, if $V_{DDO}$ (3.3V) is available and stable, but $V_{DDP}$ (2.5V) is not yet available, Pre_vop and Pre_von would be 0V, and if outp and outn is shorted to 5V, a full 5V appears across the drain and gate of transistors M120 and M121.

Also, in the event that the outputs outp and outn are shorted to 5V, the current that flows through the internal termination resistors R103 and R104, which are typically 45 ohms, is greater than 100 mA. This can cause electron migration failure if the number of vias and contacts and the metal widths used to connect outp to the resistors, as well as resistor widths, are insufficient. A thicker metal and resistor width for this signal would also mean greater area requirements, and hence increased cost.

Accordingly, there is a need in the art for a method and apparatus for on-chip protection of receive input and output driver circuitry that overcomes these disadvantages and is suitable for high frequency serial transceivers.

SUMMARY OF THE INVENTION

The present invention is directed to an apparatus and method for over-voltage, under-voltage and over-current stress protection for transceiver input and output circuitry that substantially obviates one or more of the problems and disadvantages of the related art.

An embodiment of the present invention includes a circuit for protection of a transceiver input with an input transistor having a gate, a source and a drain. A first resistor is connected between the drain of the input transistor and an input node. A plurality of reverse-biased diodes are connected between a supply voltage and the input node. An output node is connected to the source of the input transistor. A first forward-biased diode is connected between the power supply and the plurality of reverse-biased transistors. A second forward-biased diode and a second resistor are connected between the first forward-biased diode and the gate of the input transistor. A third resistor and another reverse-biased diode are connected between the first forward biased diode and a ground. A fourth resistor is connected between the output node and the ground. A second transistor has a gate, a source and a drain, wherein the source of the second transistor is connected to the output node, the gate of the second transistor is connected to ground, and the drain of the second transistor is connected to voltage divider connected in parallel with the another reverse biased diode.

A pre-driver circuit includes first and second transistors forming a differential pair that is driven by a differential input voltage. A third transistor is connected between sources of the first and second transistors and ground. First and second resistors are connected to drains of the first and second transistors, respectively. A fourth transistor is connected between a power supply voltage and the first and second resistors. Fifth and sixth transistors are connected in series between the power supply voltage and the first and second resistors, wherein a node between the fifth and sixth transistors is connected to a gate of the fourth transistor. Third, fourth and fifth resistors are connected in series with a seventh transistor and between the power supply and the ground, wherein a node between the third and fourth resistors is connected to a gate of the fifth transistor. Sixth and seventh resistors are connected in series with an eighth transistor between the power supply and the ground, wherein a node between the sixth and seventh resistors is connected to a gate of the sixth transistor. An eighth resistor is in parallel with the fifth resistor and the seventh transistor, wherein a node between the fourth and fifth resistors is connected to a gate of the eighth transistor. A ninth resistor is in parallel with the seventh resistor and the eighth transistor. Tenth and eleventh resistors are connected in series with ninth and tenth transistors between the power supply and the ground. Twelfth and thirteenth resistors are connected in series with eleventh and twelfth transistors between the power supply and the ground. A fourteenth transistor is connected between a node between the twelfth and thirteen resistors and a node between the second resistor and the second transistor. A fifteenth transistor is connected between the node between the twelfth and thirteen resistors and a node between the first resistor and the first transistor. Gates of the fourteenth and fifteenth transistors are connected to a node between the tenth and eleventh resistors. Fourteenth and fifteenth resistors are connected in series between the power supply and the ground, wherein a node between the fourteenth and fifteenth resistors is connected to gates of the ninth and eleventh transistors. A sixteenth transistor is in series with a current source for biasing the third transistor. A sixteenth resistor is connected between the node between the twelfth and thirteenth resistors and ground. A first capacitor is connected in parallel with the sixth resistor.

A driver circuit includes first and second transistors forming a differential pair and having their sources connected together and their gates connected to a differential input signal. First and second resistors are connected in series between the second transistor and ground and having a first output node between the first and second resistors. Third and fourth resistors are connected in series between the first transistor and ground and having a second output node between the third and fourth resistors. A third transistor is connected to sources of the first and second transistors. A fourth transistor is in series with a first current source and biasing a gate of the third transistor. A fifth transistor is connected between a power supply and a source of the third transistor. A sixth transistor is connected between the power supply and a source of the fifth transistor, wherein a gate of the sixth transistor is connected to a gate of the fifth transistor and to a drain of the fourth transistor. A seventh transistor and a second current source are in series between the power supply and ground, wherein a gate of the seventh transistor is connected to the gate of the fifth transistor and to the second current source. Fifth and sixth resistors are in parallel with the second and fourth resistors, respectively. Eighth and ninth transistors are connected in series between the fourth resistor and the ground. Seventh and eighth resistors are connected in parallel with the fourth resistor and the eighth and ninth transistors. A comparator compares a reference voltage with voltage from a node between the seventh and eighth resistors. A logic circuit inputs an output of the comparator, and has an output connected to a gate of the ninth transistor to control the ninth transistor based on the output of the comparator.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

An "over-voltage stress condition" refers to a 5.25V power bus voltage being shorted to receiver input or transmitter output. An "under-voltage stress condition" refers to a −1V voltage in series with a 39 ohm resistor shorted to the receiver input or transmitter output.

Figure 1:
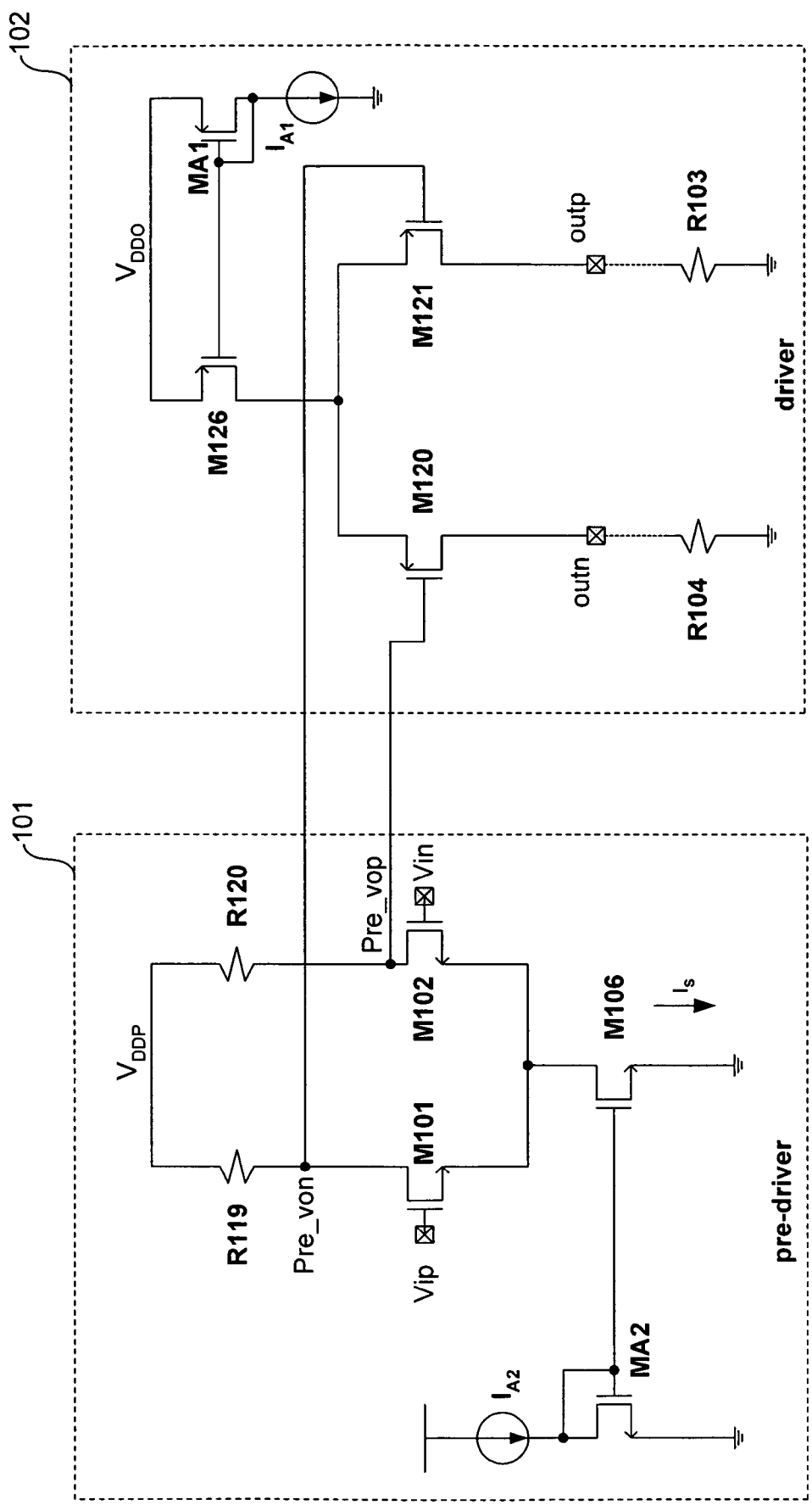
FIG. 1 shows a conventional steering circuit and a pre-driver.
Figure 2:
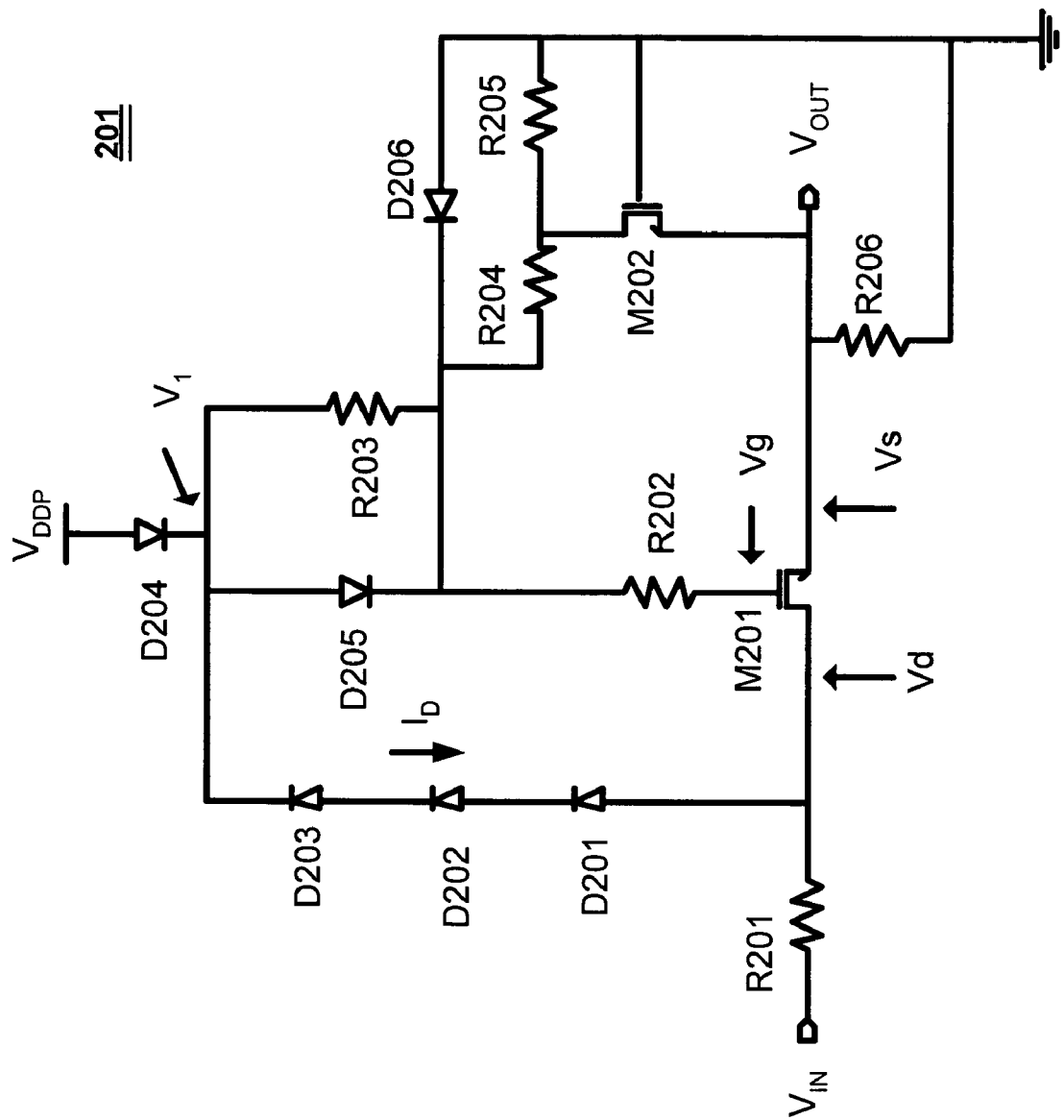
FIG. 2 shows a receive input protection circuit of one embodiment of the present invention.

The following description of a receive input protection circuit 201 of FIG. 2 uses the following:

$V_{DDP}$=2.5V, $V_{DDO}$=3.3V, $V_{DDC}$=1.2V.

Diode turn-on voltage-0.6~0.8V, $V_{DIO}$=0.6~0.8V.

$V_{busp}$=5.25V, $V_{busn}$=−1V

Referring to FIG. 2, one embodiment of the proposed receive input protection circuit 201 includes the following:

An input transistor M201 in series with a resistor R201 is connected to an input pad Vin. The input transistor M201 acts as a transmission gate in normal operation, and as a voltage limiter during over-voltage and under-voltage conditions.

Resistors R201, R202, R203 and diodes D201–D204 control a gate voltage of the input transistor M201 in the event of over-voltage and under-voltage. The gate voltage of M201 is controlled in such a way as to prevent gate-to-drain, gate-to-source and gate-to-bulk voltages of the input transistor M201 from exceeding foundry-specified maximum voltages.

Another transistor M202, in combination with the diode D206 and resistors R204, R205, lowers a gate voltage of input transistor M201 in the event of under-voltage stress at the input Vin.

The principle of operation can be explained by considering three different modes:

Mode (1)—Normal Operation:

This mode applies to a signal level of 0 volt to less than 1 volt in amplitude at Vin. Under this condition, the transistor M201 will operate as a transmission gate when input voltage Vin ranges from 0 to 1 volt. Diodes D201, D202, D203 will be turned off, and diode D204 will turn on to set the voltage level at the gate of M201. The transistor M202 will be turned off due to its negative gate-to-source voltage Vgs. In that case, in FIG. 2:

$V_1 = V_{DDO} - V_{D204} = 3.3 - 0.7 = 2.6V$ $V_g = V_1 * (R204 + R205)/(R203 + R204 + R205)$

Resistors R203, R204, R205 are chosen such that $V_g$>2V, so that the transistor M101 operates as a fully-on switch, or a transmission gate.

A drain-to-source quiescent current thru M201 is given by $I_D = (V_g - V_{thn})/R206$, where $V_{thn}$ is the threshold voltage of transistor M201. Resistor R206 is large enough that it presents a negligible resistive load as seen from the input pad Vin.

Figure 5:
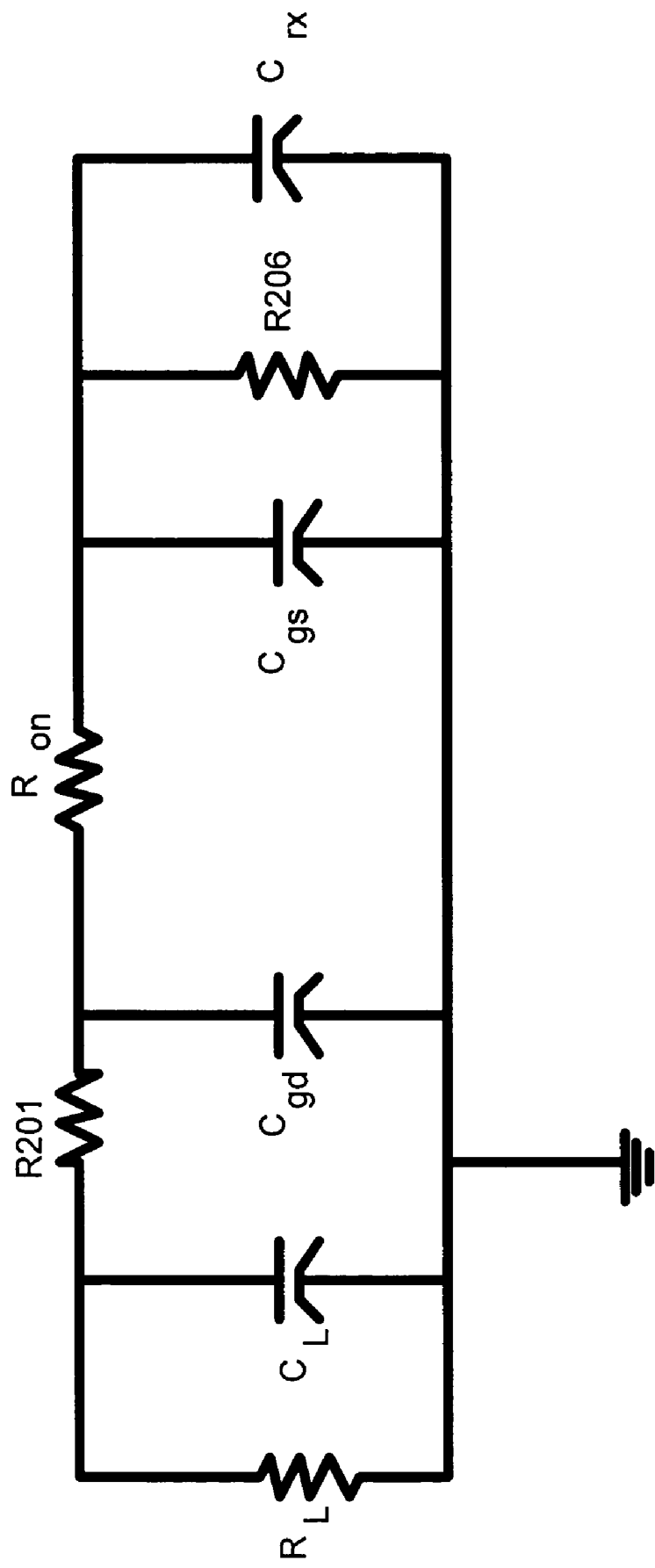
FIG. 5 shows a small signal AC model of the input network of FIG. 2.

To explain how the resistor R201 and the transistor M201 should be sized, a small signal AC model of the input network is shown in FIG. 5. From FIG. 5, parasitic pole frequencies are given as follows:

Pole 1 $(P1) \approx 1/(2*\pi*R_L*C_L)$, where $C_L$ is large load capacitance at Vin, including packaging capacitance and pad capacitance, and $R_L$ is load termination.

Pole 2 $(P2) \approx 1/(2*\pi*(R_L+R201+R_{on})*(C_{gs}+C_{rx}))$

Pole 3 $(P3) \approx 1/(2*\pi*(R_L+R201)*C_{gd})$ where $C_{gd}$, $C_{gs}$ are transistor M201's gate-drain capacitance and gate-source capacitance, respectively, $C_{rx}$ is input capacitance of the receive circuit 201, and $R_{on}$ is the on-resistance of the transistor M201.

Since the parasitic poles P1–P3 will cause attenuation at high frequencies, care should be taken to size R201 and $R_{on}$ to ensure pole frequencies are higher than required signal bandwidth.

Mode (2)—Input Shorted to 5.25V High Voltage Stress $V_{busp}$

To understand circuit 201 operation in this mode, consider input voltage needed to turn on the diodes D201, D202, D203:

$V_{DDO} - V_{D204} + V_{D201} + V_{D202} + V_{D203} = V_{DDO} + 2*V_{DIO} = 3.3 + 2*0.7 = 4.7V$

This means that a voltage of 4.7 volts is sufficient to turn on the diodes D201, D202 and D203. As such, when an over-voltage $V_{busp}$ of 5.25V is shorted to the input Vin, the diodes D201, D202, D203 will turn on.

Figure 6:
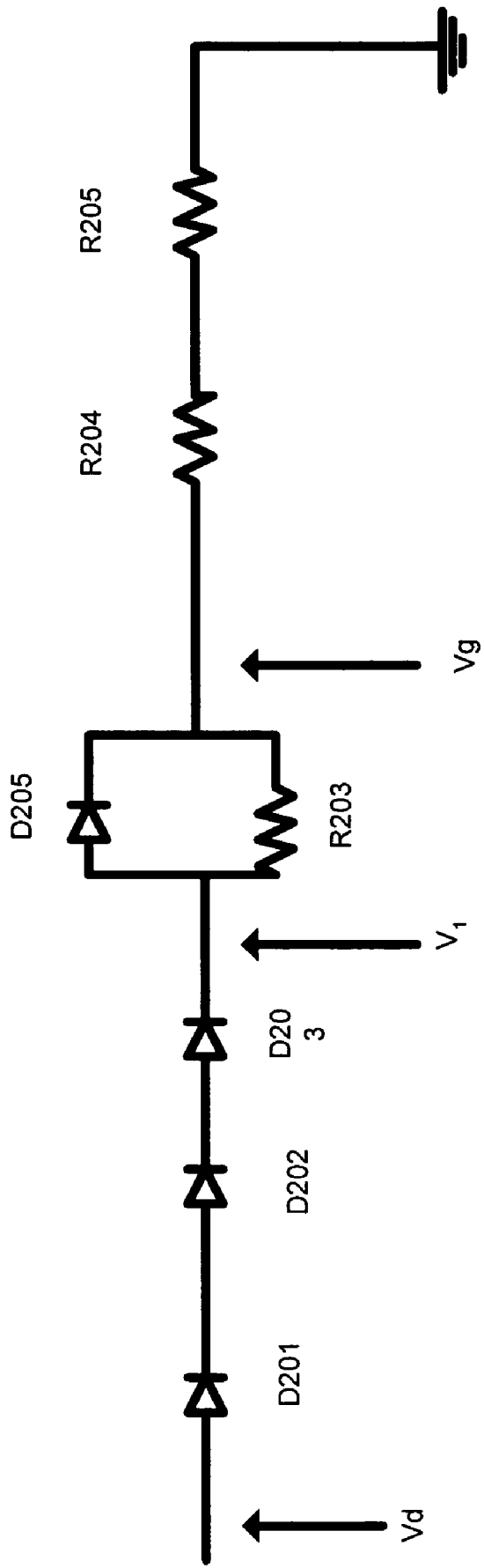
FIG. 6 is a simplified diagram of only the diode and resistor network of the input network of FIG. 2.

FIG. 6 is a simplified diagram of only the diode and resistor network in this mode. Referring to FIG. 6:

$V_1 = V_{busp} - V_{D201} - V_{D202} - V_{D203} = 5.25 - 3*0.7 = 3.15V$ $V_1$ is comparable to $V_{VDDO}$, so the diode D204 will turn off. It can be assumed that for this case, the input protection circuit 201 is powered by $V_{busp}$, $V_{busn}$.

$V_g = V_1 - V_{R203} = 3.15 - 0.2 = 2.95V$ $V_{R203}$ is voltage drop at resistor R203. In normal operation and with over-voltage protection, $V_{R203}$ is designed to be around 0.2V. The transistor M201 turns on, so $V_{gs}$ (gate-to-source voltage drop) of M201 is approximately one threshold voltage:

$V_{gs} \approx V_{thn}$ $V_s \approx V_g - V_{thn} \approx 3.15 - 0.7 = 2.45V$ $V_s$ is a voltage seen at pin Vout, which is connected to input Vin of the primary RX circuit. This voltage is less than a foundry-specified maximum voltage, and will not damage to internal circuitry. To consider drain-to-source voltage of transistor M201:

$V_{ds} = V_{D201} + V_{D202} + V_{D203} + V_{R203} < 2.6V$

From the above equations, there are no large voltage drops across transistor M201's drain gate junction ($V_{gd}$) and source-gate junction ($V_{gs}$).

The current $I_D$ flowing through the diodes D201, D202 and D203 is estimated by referring to FIG. 6:

$I_D = I_{D201} = I_{D202} = I_{D203} = (V_{busp} - 0 - 3*V_{DIO})/(R203 + R204 + R205) = (5.25 - 3*0.7)/(R203 + R204 + R205) = 3.15/(R203 + R204 + R205)$ Resistors R203, R204, R205 are chosen large such that only negligible current $I_D$ flows through the diodes D201, D202, D203.

Mode (3)—Input Shorted to −1 V Stress Voltage $V_{busn}$.

The diodes D201, D202, D203 will turn off when the input Vin is shorted to −1V stress voltage. $V_g$ of M201 is powered by the $V_{DDO}$ power supply:

$$V_1 = V_{VDDO} - V_{DIO} = 3.3 - 0.7 = 2.5v$$

A parasitic diode between a P substrate and an N diffusion region at the drain of the NMOS transistor M201 will be forward biased, and $V_d$, $V_s \approx -0.7V$. The purpose of R201 is to limit the current flowing to $V_{busn}$. The resistor R201 is chosen around 200 Ohms, so that current from P substrate to the N diffusion region of the NMOS transistor M201 is not excessive enough to cause electron migration damage:

$$I_{R201} = (-V_{thn}) - (V_{gnd})/R201 \cong (-0.7 + 1)/R201 = 0.3/R201$$

Gate voltage of M201 is pulled lower to reduce the voltage drop across drain-gate junction and source-gate junction of M201 by turning on M202 and sinking more current from R201.

The current through R203 is given by the following equation:

$$I_{R203} = ((V_{VDDO} - V_{DIO} - (-V_{thn}))/(R203 + R204) \cong (3.3 - 0.7 + 0.7)/(R203 + R204) = 3.3 \, V/(R203 + R204)$$

The gate voltage of transistor M201 is therefore:

$$V_g = V_1 - R^* I_{R203} = 2.5 - R203^* I_{R203}$$

The resistors R203, R204 are chosen such that $V_g$ is around 2.1V. $V_{gs}$ and $V_{gd}$ of the transistor M201 is 2.8V, which is less than 2.875V typically specified breakdown voltage.

Note that the diode network could be replaced by a transistor network where the transistor is configured as a diode with its gate is shorted to drain.

The input protection circuitry of FIG. 2 essentially prevents the input transistor M201 from seeing over-voltage and under-voltage conditions at the input Vin.

Figure 3:
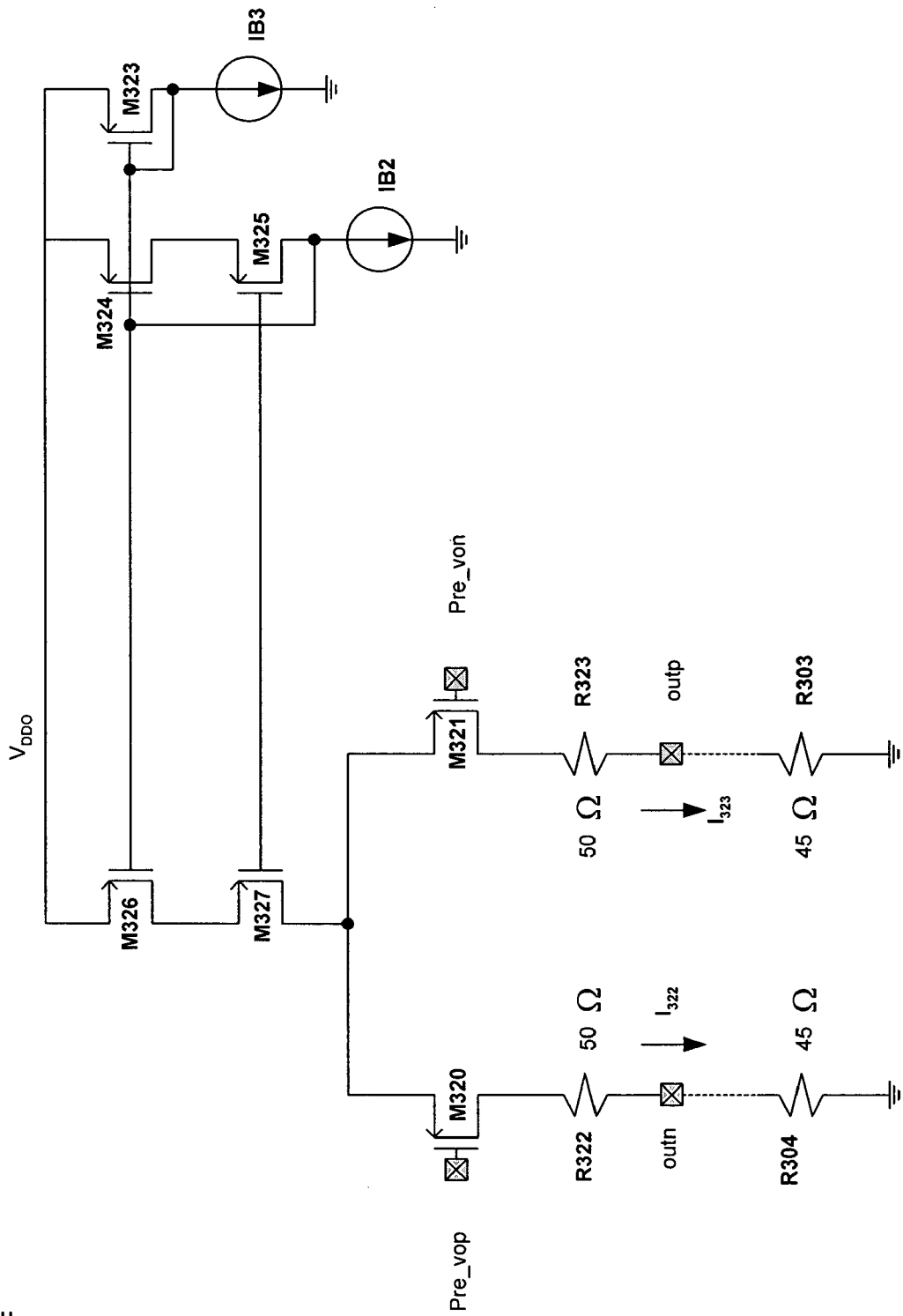
FIG. 3 shows a driver circuit 301 with breakdown protection circuitry, as shown, respectively.
Figure 4:
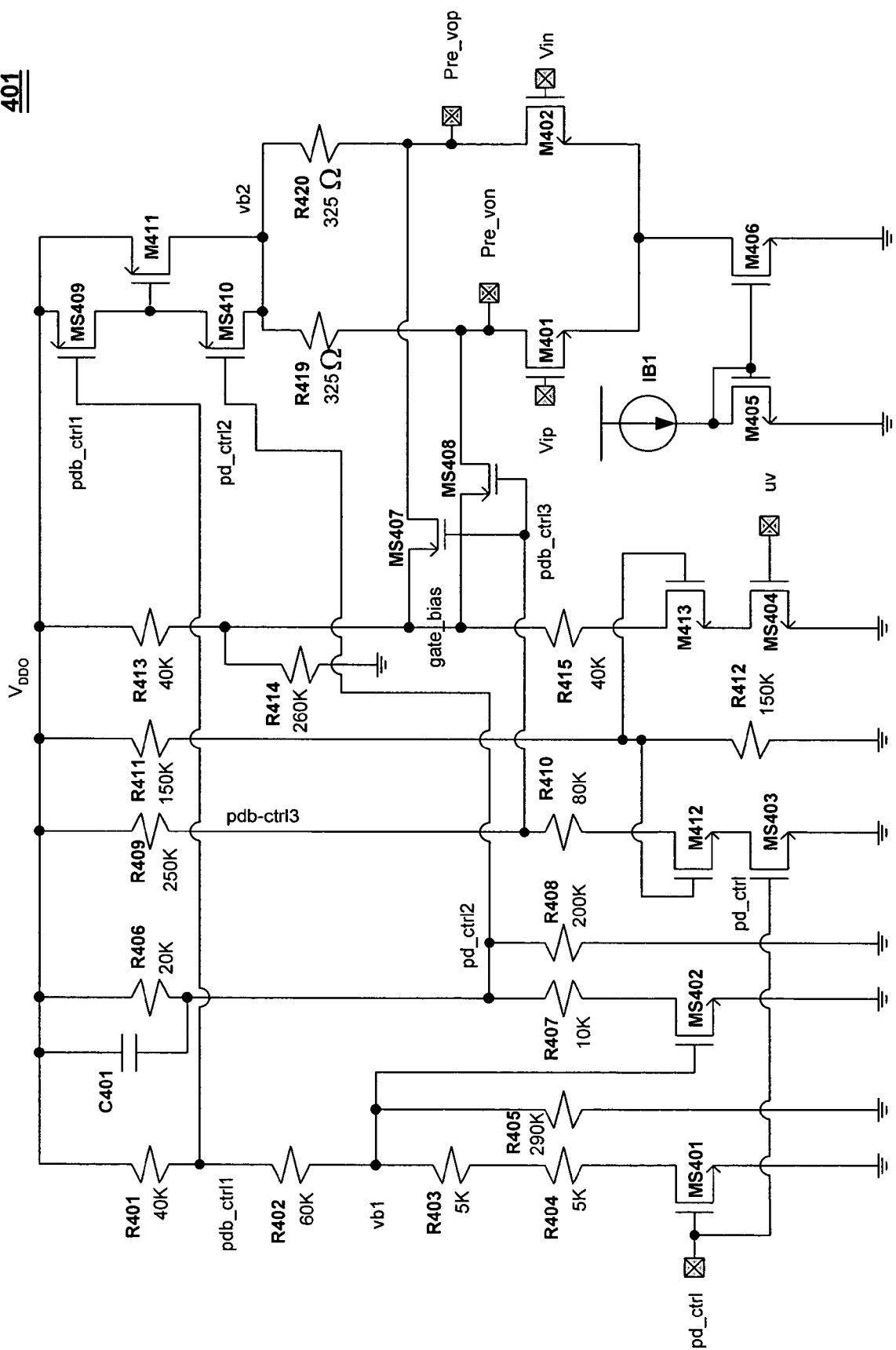
FIG. 4 shows a transmit pre-driver output protection circuit.

Transmit (TX) driver output protection includes a pre-driver 401 and a driver circuit 301 with breakdown protection circuitry, as shown FIG. 4 and FIG. 3, respectively. The transmit driver 301 output protection circuitry includes series voltage drop resistors R322 and R323 between driver outputs outp, outn, and the differential pair transistors (M320 and M321).

The pre-driver 401 is illustrated in FIG. 4. The supply voltage $V_{DDO}$ of the pre-driver 401 is the maximum supply voltage and the same supply voltage of the driver 301 circuitry ($V_{DDO}$), which permits a voltage drop from $V_{DDO}$ to protect the transistors M401 and M402 in the pre-driver 401. This also includes transistors M411, MS409 and MS410.

A network of resistors and transistors form switchable voltage references to bias the pre-driver 401 in normal, power down and undervoltage mode. These reference voltages are designed such that at all conditions, no gate-to-source, gate-to-drain or gate-to-bulk voltages of any transistor exceeds the foundry specified maximum voltage.

The pre-driver 401 has two inputs Vip and Vin with voltage input levels ranging from 0 to 2.5V. It has two outputs Pre_von and Pre_vop. There are also two control inputs pd_ctrl and uv.

uv is asserted high when a voltage detector detects that the output nodes of driver, outp or outn, is shorted to a voltage below −0.5V. pd_ctrl is asserted high when the driver 301 and pre-driver 401 are in power down mode.

When transistor M411 is turned on and conducting a current, depending on the input voltages at nodes Vip, Vin, this current will be diverted into either R419 or R420, and hence generate appropriate output voltages at Pre_vop and Pre_von. Resistors R401 to R415 are used to generate appropriate biasing voltage. Transistors MS401 to MS404 and MS407 to MS410 are NMOS transistor switches that are controlled by the power-down signals pd_ctrl, pdb_ctrl1, pd_ctrl2 or pdb_ctrl3. Transistors M412 and M413 are cascode transistors used to ensure that the gate-drain voltages of transistors MS403 and MS404 are less than 2.875V even when NMOS transistors MS403 and MS404 are off.

The voltages at nodes pd_ctrl, pdb_ctrl1, vb1, pd_ctrl2, pdb_ctrl3 and gate_bias are determined as follows: first, when pd_ctrl is not asserted, pd_ctrl will be 0V. MS401 will be turned off, and there is no current flowing through R403 and R404. Resistors R401, R402 and R405 form a voltage divider, and the voltage at node pdb_ctrl1 will be as follows:

$$\text{pdb\_ctrl1} = \frac{R402 + R405}{R401 + R402 + R405} \times V_{DDO}$$
$$= \frac{60 \, K + 290 \, K}{40 \, K + 60 \, K + 290 \, K} \times 3.3$$
$$= 2.96 \, V$$

The voltage at node vb1 will be as follows:

$$vb1 = \frac{R405}{R401 + R402 + R405} \times V_{DDO}$$
$$= \frac{290 \, K}{40 \, K + 60 \, K + 290 \, K} \times 3.3$$
$$= 2.45 \, V$$

Hence, the transistor MS402 will be turned on by the voltage at node vb1, R406, R407 and R408 form a voltage divider, the voltage at node pd_ctrl2 assuming the ON resistance of MS402 is negligible, will be as follows:

$$\text{pd\_ctrl2} = \frac{R407 \, // \, R408}{R406 + (R407 \, // \, R408)}$$
$$= \frac{10 \, K \, // \, 200 \, K}{20 \, K + (10 \, K \, // \, 200 \, K)} \times 3.3 \, V$$
$$= 0.323 \times 3.3 \, V$$
$$= 1.07 \, V$$

The transistor MS403 will be turned off by voltage at pd_ctrl (0V), and the voltage at node pdb_ctrl3 will be 3.3V. Resistors R411 and R412 form a voltage divider to provide $V_{DDO}/2$ to bias transistors M412 and M413.

PMOS transistors MS407, MS408 will be turned off by pdb_ctrl3 (3.3V). PMOS transistor MS409 will be turned off as well by pdb_ctrl1 (2.96V), but transistor MS410 will be turned on, since pd_ctrl2=1.07V. M411 is connected as a diode-connected transistor with a Vgs (gate-source voltage) drop of about 0.8V so the voltage at vb2 will be at 2.5V.

Figure 7:
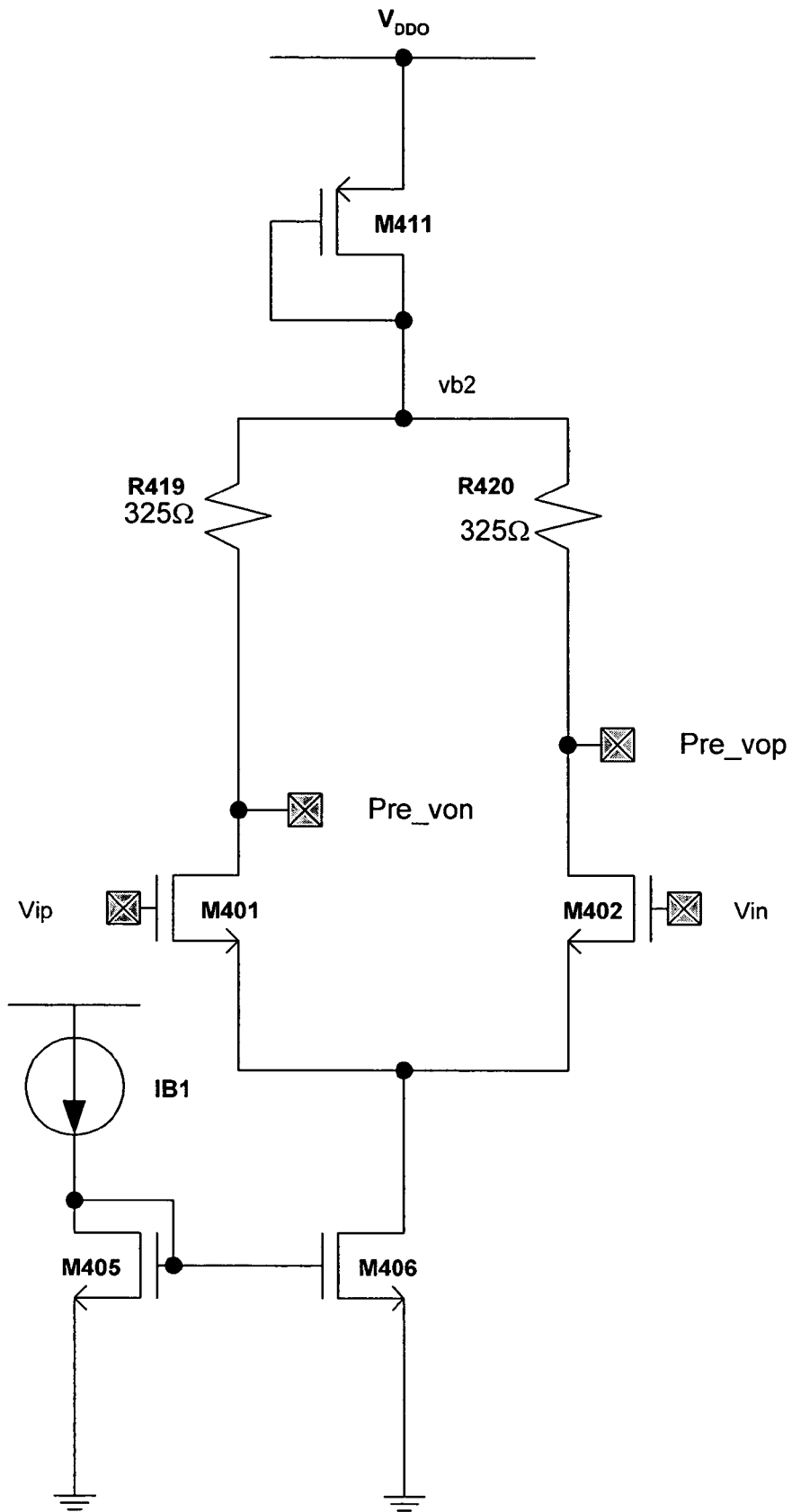
FIGS. 7 and 8 show a simplified schematic diagram of the pre-driver circuit of FIG. 4 without reference voltage circuitry.

A simplified schematic diagram showing the basic pre-driver 401 circuit without all the other reference voltage circuitry, when pd_ctrl is not asserted, is shown in FIG. 7. Essentially, the drains of the transistors M401 and M402 are prevented from reaching $V_{DDO}$ (3.3V) through the voltage drop provided by the diode-connected PMOS transistor M411.

If uv in FIG. 4 is not asserted, the voltage at node gate_bias will be as follows:

$$\text{gate\_bias} = \frac{R414}{R413 + R414} \times V_{DDO}$$
$$= \frac{260\text{ K}}{40\text{ K} + 260\text{ K}} \times 3.3\text{ V}$$
$$= 0.867 \times 3.3\text{ V}$$
$$= 2.86\text{ V}$$

If uv is asserted, resistors R413, R414 and R415 form a voltage divider. The node voltage at gate_bias (assuming negligible ON resistance of transistors MS404 and M413) will be as follows:

$$\text{gate\_bias} = \frac{R414 \,//\, R415}{R413 + (R414 \,//\, R415)} \times 3.3\text{ V}$$
$$= \frac{260\text{ K} \,//\, 40\text{ K}}{40\text{ K} + (260\text{ K} \,//\, 40\text{ K})} \times 3.3\text{ V}$$
$$= 0.464 \times 3.3$$
$$= 1.53\text{ V}$$

In the case when pd_ctrl is asserted to enable power down, MS401 will be turned on, and resistors R401 to R405 forms a voltage divider and the voltage at node pdb_ctrl1 will be as follows:

$$\text{pdb\_ctrl1} = \frac{R402 + ((R403 + R404) \,//\, R405)}{R401 + R402 + ((R403 + R404) \,//\, R405)} \times V_{DDO}$$
$$= \frac{60\text{ K} + ((5\text{ K} + 5\text{ K}) \,//\, 290\text{ K})}{40\text{ K} + 60\text{ K} + ((5\text{ K} + 5\text{ K}) \,//\, 290\text{ K})} \times 3.3$$
$$= 2.1\text{ V}$$

The voltage at node vb1 will be as follows:

$$vb1 = \frac{(R403 + R404) \,//\, R405}{R401 + R402 + ((R403 + R404) \,//\, R405)} \times V_{DDO}$$
$$= \frac{(5\text{ K} + 5\text{ K}) \,//\, 290\text{ K}}{40\text{ K} + 60\text{ K} + ((5\text{ K} + 5\text{ K})) / 290\text{ K})} \times 3.3$$
$$= 0.29\text{ V}$$

Hence, transistor MS402 will be turned off, resistors R406 and R408 form a voltage divider, and the voltage at node pd_ctrl2 will be as follow:

$$\text{pd\_ctrl2} = \frac{R408}{R406 + R408}$$
$$= \frac{200\text{ K}}{20\text{ K} + 200\text{ K}} \times 3.3\text{ V}$$
$$= 0.909 \times 3.3\text{ V}$$
$$= 3\text{ V}$$

Transistor MS403 will be turned on by voltage at pd_ctrl (asserted high), and the voltage at node pdb_ctrl3 will be as follows:

$$\text{pdb\_ctrl3} = \frac{R410}{R409 + R410} \times V_{DDO}$$
$$= \frac{80\text{ K}}{250\text{ K} + 80\text{ K}} \times 3.3\text{ V}$$
$$= 0.8\text{ V}$$

Transistors MS407, MS408 will be turned on by pdb_ctrl3 (0.8V). Hence, the voltage, which is either 2.86V or 1.53V at gate_bias, will be passed on to nodes Pre_von, Pre_vop. At the same time, MS409 will be turned on by pdb_ctrl1 (2.09V), while MS410 will be turned off by pd_ctrl2 (3V). Hence, the gate and source of M411 will be pulled to $V_{DDO}$, M411 will be off, and no current will flow through M411. The nodes Pre_von, Pre_vop will be biased to the same voltage as the node gate_bias.

Figure 8:
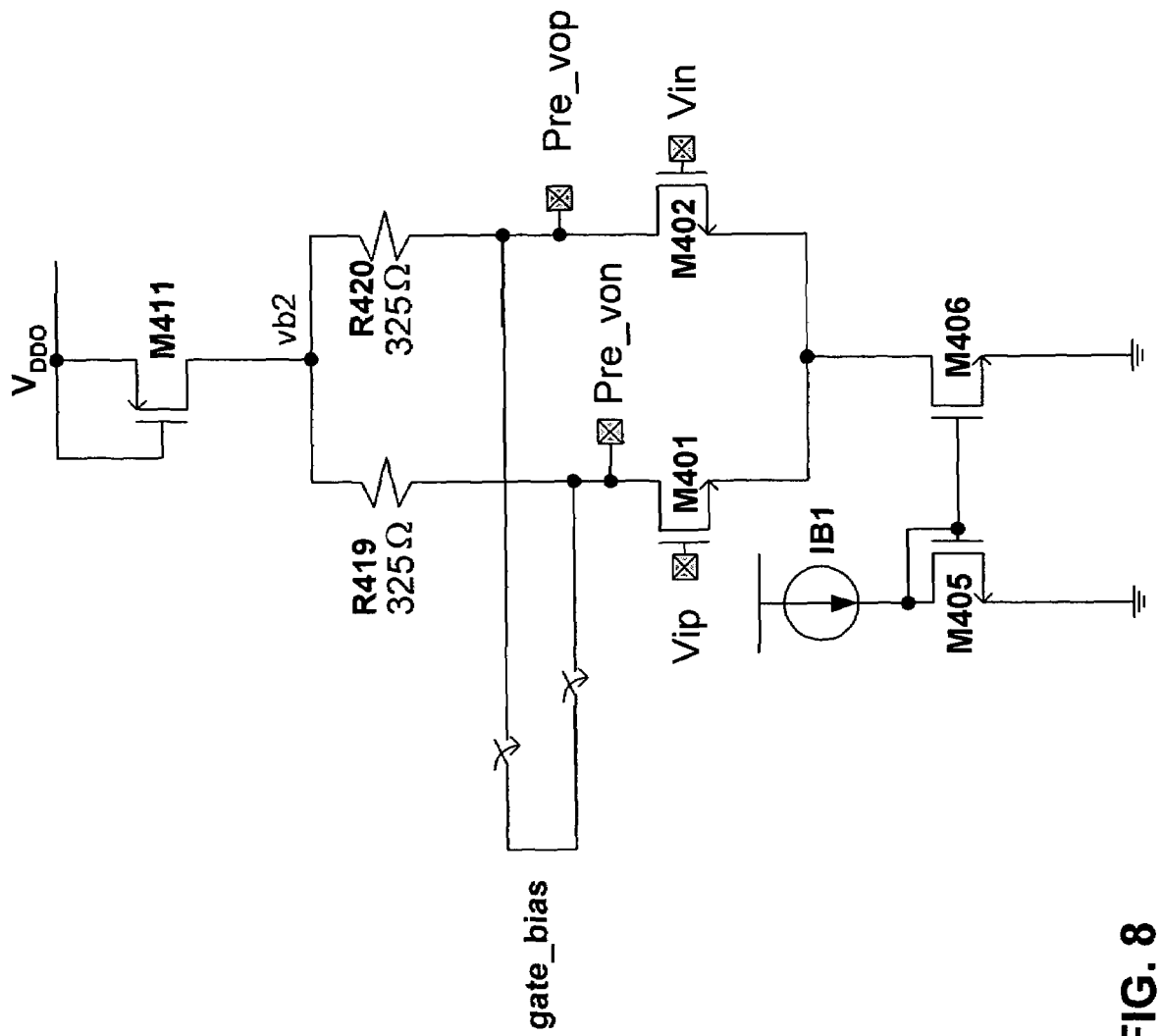

A simplified schematic diagram of the pre-driver 401 without the reference voltage circuitry (when pd_ctrl is asserted) is shown in FIG. 8. Essentially, when the pd_ctrl is asserted to enable the power-down mode, the outputs of the pre-driver 401 (Pre_vop, Pre_von) are biased to a suitable voltage (gate_bias) such that the driver 301 input transistors M320, M321 do not experience gate overvoltage stress.

In the driver 301 of FIG. 3, transistors M324 through M327 form a current mirror. Transistors M320 and M321 are the input differential pairs. Resistors R322 and R323 are included to protect the gate oxides of transistors M320 and M321, respectively, from over voltage stress when the nodes outp or outn are shorted to 5V or −1V externally, as will be explained below. The resistors R322, R323 do not degrade the high frequency performance of the driver 301 since the impedance looking into R322 and R323 is dominated by the tail current sources M326 and M327.

A voltage detector at driver 301 outputs outp and outn is able to detect over-voltage and under-voltage conditions and to use this information to:

(1) disconnect internal termination resistors R303 and R304 from outp and outn to 0V in the case of overvoltage; and (2) connect appropriate reference voltages for biasing the pre-driver 401 in such a way as to prevent transistor gate-to-drain, source or bulk voltages from exceeding maximum specified voltages.

The detailed operation of the breakdown protection function inside the pre-driver 401 and the driver 301 will be examined under the following four different over-voltage and under-voltage situations. In each situation, the driver 301 may be powered up (pd_ctrl is low) or powered down (pd_ctrl is high).

| Situation | Force voltage at driver output outp and outn (V) | $V_{DDO}$ | pd_ctrl |
|---|---|---|---|
| 1 | 5.25 | 3.3 V | Not asserted (Low) |
| 2 | 5.25 | 3.3 V | Asserted (High) |
| 3 | −1 V in series with 39 Ω | 3.3 V | Not asserted (Low) |
| 4 | −1 V in series with 39 Ω | 3.3 V | Asserted (High) |

Situation 1: pd_ctrl is not asserted. The output node, outp, of the driver 301 of FIG. 3 is shorted to 5.25V so uv will not be asserted (uv=0). From the discussion above:

| Node | Voltage (V) |
| --- | --- |
| Pd_ctrl | 0 |
| pdb_ctrl1 | 2.96 |
| pd_ctrl2 | 1.07 |
| pdb_ctrl3 | 3.3 |
| gate_bias | 2.86 |

Therefore, PMOS switches MS407 and MS408 will be turned off by pdb_ctrl3 (3.3V) so that the voltage at node gate_bias can not be passed through to node Pre_von, Pre_vop. Switch MS409 will be turned off by pdb_ctrl1 (2.96V). However, MS410 will be turned on by pd_ctrl2 (1.07V) so that transistor M411 will be conducting a current that will be diverted into R419 or R420, depending on the inputs of Vip and Vin. M411 is configured essentially as a transistor diode. The node voltage at vb2 will be 2.5V due to the transistor diode voltage drop of 0.8V of M411. The situation can be subdivided into two cases according to the input voltage at Vip and Vin:

Case (a). Vip=2.5, Vin=0V. Under these settings, the 4 mA from M411 inside the pre-driver 401 will be diverted into R419, creating a voltage drop of 1.3V (4 mA×325 Ω) on R419, so the voltage at Pre_von will be 1.2V (2.5V−1.3V). The voltage at Pre_vop will be 2.5V, since there is no current flowing through R420. The output of the pre-driver 401 drives the inputs Pre_vop and Pre_von of the driver 301. In the driver 301, PMOS transistor M321 is biased by Pre_von at 1.2V, but M320 is biased by Pre_vop at 2.5V. The output node outp is connected to 5.25V. This voltage is higher than the $V_{DDO}$ inside the driver 301, so a current is expected to flow into the node outp and pass through R323 and M321.

The magnitude of the current flowing through M321 is determined by two factors. First, since the gate of M321 is biased at 1.2V, the drain-gate voltage of M321 will be much higher than Vth (threshold voltage of a transistor), so M321 will turn on fully and will conduct a large current.

Secondly, if the drain voltage of PMOS transistor M321 is at a diode drop voltage (i.e., turn-on voltage $V_d$ of a diode, about 0.45V) above $V_{DDO}$, the parasitic PN junction between the drain and bulk regions of M321 will be turned on. However, since the gate voltage of M321 is at 1.2V, and the drain voltage of M321 is less than 3.75V, the current is dominated by the first factor. The current and drain voltage of M321 can be calculated by equating the following two current equations of M321 and R323:

$$I_{323} = UC_{OX} \times \frac{W}{L}\left(V_{DG} - V_{TH} - \frac{V_{DS}}{2}\right)V_{DS}$$

$$= UC_{OX}\frac{W}{L}\left(V_D - V_G - V_{TH} - \frac{V_{DS}}{2}\right)V_{DS}$$

$$I_{323} = \frac{5.25 - V_D}{50}$$

The drain voltage ($V_D$) of M321 is 3.6V and the current $I_{323}$ flowing through R323 and M321 is about 33 mA. R323 provides a voltage drop of 1.65V (33 mA×50 ohms). The gate-drain voltage of M321 is 2.4V (3.6−1.2) and is lower than the maximum specified transistor gate-to-drain or gate-to-source voltage of 2.875 V. Transistor M320 will also be safe, since its gate voltage is 2.5V and source voltage is about 3.4V and a gate-source voltage of only 0.9V.

Case (b). Vip=0V, Vin=2.5V. The 4 mA from M411 inside the pre-driver 401 will be diverted into R420 and the voltage at Pre_vop will be 1.2V, but the voltage at Pre_von will be 2.5V. Hence, the gate of M321 will be biased at 2.5V. There will be a current $I_{322}$ flowing into the node outp and passing through R322 and M320. The magnitude of the current $I_{322}$ is determined by a combination of the first and second factors as described above. Typically, the drain voltage is 3.7V and the current is around 31 mA so that the gate-drain voltage of M321 will be 1.2V (3.7V−2.5V), which is far below the overvoltage limit of 2.875 V.

Situation 2: pd_ctrl is asserted to power down but uv is not asserted. The output node outp is connected to 5.25V. From the circuit operation as discussed before, we have:

| Node | Voltage (V) |
| --- | --- |
| Pdb | 0 |
| pd_ctrl | 2.2 |
| pdb_ctrl1 | 2.1 |
| pd_ctrl2 | 3 |
| pdb_ctrl3 | 0.8 |
| gate_bias | 2.86 |

MS410 will be turned off by pd_ctrl2 (3V), MS409 will be turned on by pdb_ctrl1 (2.1V), and the gate of M411 will be shorted to $V_{DDO}$. Hence, M411 will be turned off and there will be no current flowing through M411. At the same time, MS406, MS407, and MS408 will be turned on by pdb_ctrl3 (0.8V) and the voltage at gate_bias will be used to bias node Pre_von, Pre_vop at 2.86V. Therefore, in the driver 301, the gates of M320 and M321 will be biased at 2.86V. With a 5.25V connected at outp, there will be current flowing through R323 and into M321. The voltage at the drain of M321 will be determined by the two factors mentioned in case (a) of situation 1. However, the drain voltage of M321 will be higher, as in case (a) and case (b) of situation 1, since the gate voltage of M321 is higher, at 2.86V. So the two factors will affect the drain voltage of M321. The PN junction formed by drain-bulk region of M321 is turned on, since $V_D$ (drain voltage) of M321 is larger than one $V_d$ (turn-on voltage threshold of a diode) above $V_{DDO}$. If the drain voltage of M321 is 4V, the drain-gate voltage of M321 will be 1.14V. Therefore, the gate oxide of M321 will not suffer from the over-biasing.

Situation 3: pdb is not asserted, but uv is asserted, since there is a −1V voltage source in series with a 39 Ω resistor connected at the output node outp of the driver 301. Hence, the voltage of gate_bias will be 1.53V as discussed before. The node voltages inside the pre-driver 301 are summarized as follows:

| Node | Voltage (V) |
| --- | --- |
| Pdb | 1.2 |
| Pd_ctrl | 0 |
| Pdb_ctrl1 | 2.96 |
| Pd_ctrl2 | 1.07 |
| Pdb_ctrl3 | 3.3 |
| Gate_bias | 1.53 |

Figure 9:
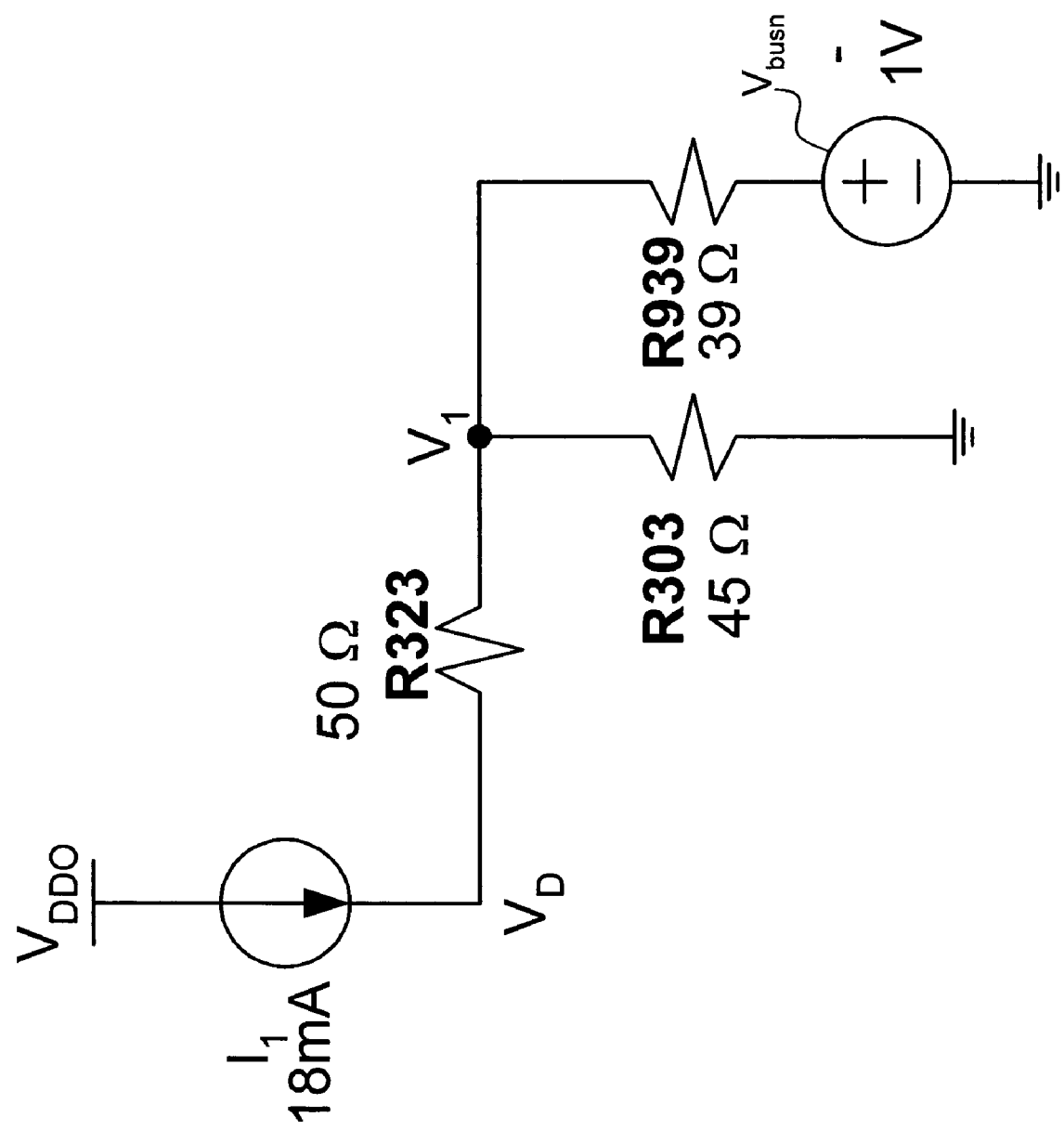
FIGS. 9 and 10 show a simplified network of an output node of the driver of FIG. 3.

This situation can be subdivided into the following two cases, similar to situation 1:

Case (a). Vip=2.5V, Vin=0V. This is same as the case (a) of situation 1, where Pre_vop will be biased at 2.5V. Pre_von will be biased at 1.2V. With these two voltages applied to the driver 301, transistor M321 will be turned on, and transistor M320 will be turned off. M321 will allow the current $I_{323}$ from the current source transistors M326 and M327 to flow through, and this current $I_{323}$ (18 mA) will also flow through R323 and into the 45 Ω internal termination resistor R303 to ground and 39 Ω resistor R939 in series with −1V power source (see FIG. 9). The voltage at the drain of M321 can be obtained by referring to a simplified network shown on FIG. 9:

$$I_1 = \frac{V_1}{R303} + \frac{V_1 + 1}{R939}$$

$$18 \text{ mA} = \frac{V_1}{45} + \frac{V_1 + 1}{39} = I_1$$

$$V_1 = -0.16$$

$$V_D = I_1 \times R323 + V_1 = 0.84$$

Therefore, the $V_D$ (drain voltage) of M321 is 0.84V, and the gate-drain voltage of M321 will be only 0.36V (1.2−0.8V).

Figure 10:
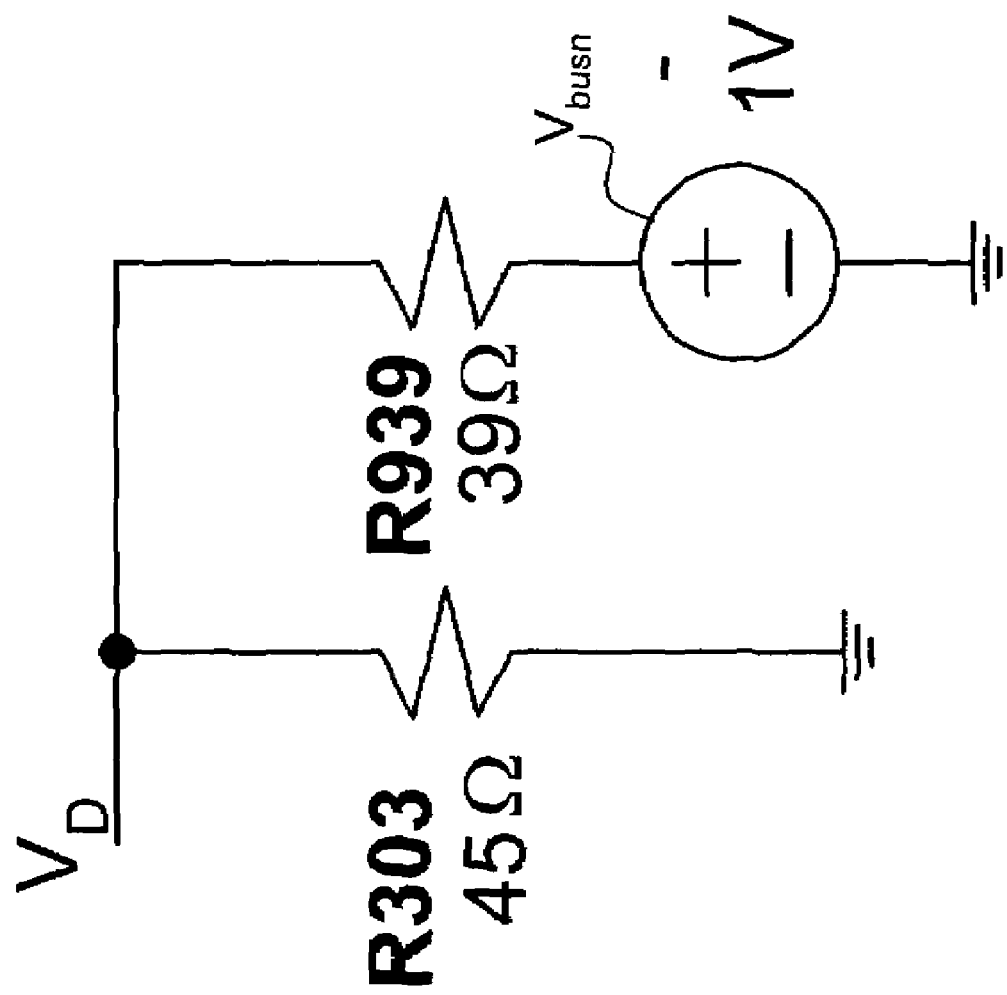

Case (b). Vip=0V, Vin=2.5V. Under these settings, M321 will be turned off, and no current will flow through it, but M320 will be biased at 1.2V and will be turned on. M320 will have $I_{222}$=18 mA flowing through it, coming from the current sources M326 and M327. Under this condition, the drain voltage of M321 can be obtained by considering the simplified circuit shown in FIG. 10:

$$V_D = -1 \times \frac{R303}{R939 + R303} = -0.54 \text{ V}$$

Therefore, the gate-drain bias of M321 will be 3.04V. However, since M321 is not conducting any current, the tolerance for gate-drain voltage will be higher than 3.04V.

Situation 4: pdb is asserted, and uv is asserted as well. Hence, node Pre_von, Pre_vop in the pre-driver 401 will be at 1.53V, and the gates of transistors M20 and M321 in the driver 301 will be biased at 1.53V as well. However, since the current bias blocks IB1, IB2, IB3 are all turned off when pdb is asserted, transistors M320 and M321 will not conduct any current. The drain voltage of M321 will be same as case (b) of situation 3, or −0.54V. Hence, the gate-drain bias of M321 will be 2.07V (1.53+0.54) and M321 is safe from over voltage limits.

Figure 11:
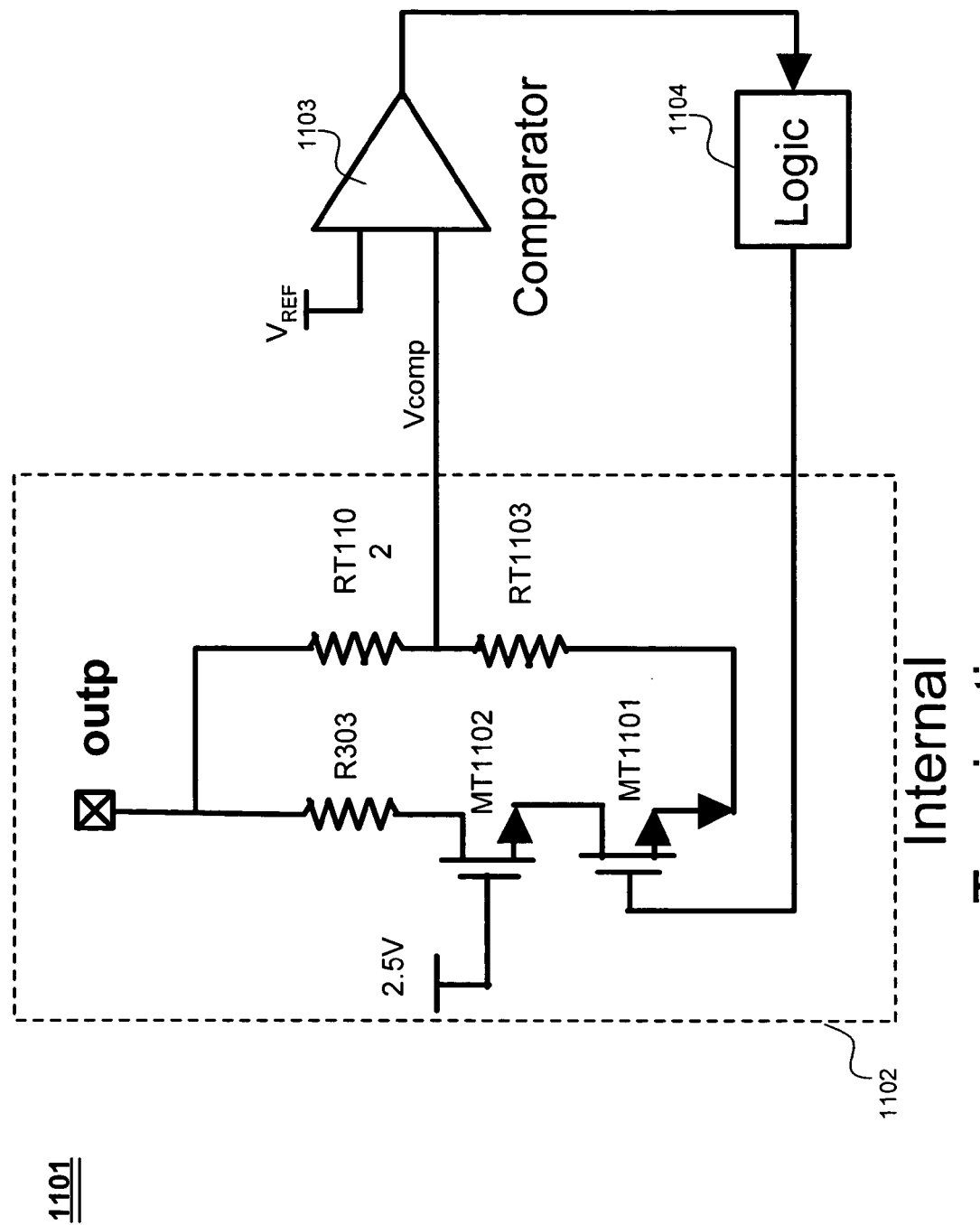
FIG. 11 shows overcurrent protection circuitry for the driver of FIG. 3.

In FIG. 3, without overcurrent protection, the internal 45 ohm termination resistor R303 would see a 116 mA current flowing through it, if an over-voltage stress of 5.25V is shorted to outp. Referring to FIG. 11, overcurrent protection circuitry 1101 includes internal termination circuitry 1102, with the resistor R303, and NMOS transistors MT1102 and MT1101. Note that only 1 side (outp) is shown in FIG. 11. (The entire FIG. 11 can be replicated for outn.) In normal operation, the transistor MT1101 is switched on, and a 45 ohm termination resistance is seen looking in from outp. The transistor MT1102, whose gate is connected to 2.5V, prevents the drain of transistor MT1101 from seeing a large voltage when outp is shorted to 5.25V.

RT1102 and RT1103 have a total impedance much larger than 45 ohms. They function as a voltage divider to divide down the voltage seen at outp. The voltage Vcomp is given by RT1103/(RT1102+RT1103)×Voutp. RT1102 and RT1103 are chosen such that Vcomp is low enough, and input devices of a voltage comparator 1103 do not see an over-voltage stress when outp sees 5.25V.

In the voltage comparator 1103, one input is connected to a reference voltage ($V_{REF}$) and another is connected to Vcomp. The voltage comparator 1103 asserts high when Vcomp is greater than $V_{REF}$.

A logic block 1104 turns transistor switch MT1101 on or off depending on the comparator output and other system signals (not shown here). In the event that a 5.25V is seen at outp, Vcomp will increase to a voltage larger than $V_{REF}$, and will cause the voltage comparator 1103 to go high. This will then cause the logic block 1104 to assert a low to turn off transistor MT1101. Since MT1101 is shut off, no current flows through the 45 ohm termination resistor R303.

The RX input protection circuit 201 described above ensures that the receive input circuitry it is connected to and its own circuitry is not subjected to voltages exceeding foundry specified maximum voltages for reliable operation of transistors in the event of an over-voltage 5.25V and under-voltage −1V stress.

The TX output protection circuit 1101 described above ensures that the driver 301 circuitry is not subjected to voltages exceeding foundry specified maximum voltages for reliable operation of transistors in the event of an over-voltage 5.25V and under-voltage −1V stress. It also protects the resistive termination circuitry of FIG. 11 in the event of an over-voltage causing an over-current condition.

Both the TX and RX input protection circuits described above protect transistor devices without degrading the high frequency performance of the transmit output and receive input circuits. The input and output protection circuits described above also do not require all supply voltages to be stable before an over-voltage or under-voltage occurs.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A circuit for protection of a transceiver input, comprising:
   an input transistor having a gate, a source and a drain;
   a first resistor connected between the drain of the input transistor and an input node;
   a plurality of reverse-biased diodes connected between a supply voltage and the input node;
   a forward-biased diode connected between the supply voltage and the plurality of reverse-biased diodes; and
   an output node connected to the source of the input transistor.

2. The circuit of claim 1, further including a second forward-biased diode and a second resistor connected between the first forward-biased diode and the gate of the input transistor.

3. The circuit of claim 2, further including a third resistor and another reverse-biased diode connected in series between the first forward biased diode and a ground.

4. The circuit of claim 3, further including a fourth resistor connected between the output node and the ground.

5. The circuit of claim 4, further including a second transistor having a gate, a source and a drain, wherein the source of the second transistor is connected to the output node, the gate of the second transistor is connected to ground, and the drain of the second transistor is connected to a voltage divider connected in parallel with the another reverse biased diode.

6. A circuit for protection of transceiver input comprising:
an input transistor having a gate, a source and a drain;
a first resistor connected between the drain of the input transistor and an input node; and
an output node connected to the source of the input transistor; and
a second transistor having a gate, a source and a drain, wherein the source of the second transistor is connected to the output node, the gate of the second transistor is connected to ground, and the drain of the second transistor is connected to a voltage divider connected in parallel with a first reverse-biased diode.

7. The circuit of claim 6, further including a plurality of reverse-biased diodes connected between a supply voltage and the input node.

8. The circuit of claim 7, further including a first forward-biased diode connected between the power supply and the plurality of reverse-biased transistors.

9. The circuit of claim 8, further including a second forward-biased diode and a second resistor connected between the first forward biased transistor and the gate of the input transistor.

10. The circuit of claim 9, further including a third resistor and another reverse-biased diode connected between the second forward biased diode and a ground.

11. The circuit of claim 10, further including a fourth resistor connected between the output node and the ground.

* * * * *

UNITED STATES PATENT AND TRADEMARK OFFICE
CERTIFICATE OF CORRECTION

PATENT NO. : 7,209,333 B2
APPLICATION NO. : 10/787937
DATED : April 24, 2007
INVENTOR(S) : Lee et al.

It is certified that error appears in the above-identified patent and that said Letters Patent is hereby corrected as shown below:

At column 7, line 22, replace "IR203=((VVDDO" with -- IR203=(VVDDO -- ;

At column 9, line 45, replace "R404)//R405" with -- R404)//R405) -- ; and

At column 9, line 47, replace "5 K))/290 K)" with -- 5 K)//290 K) -- .

Signed and Sealed this

Twenty-third Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 7,209,333 B2
APPLICATION NO. : 10/787937
DATED : April 24, 2007
INVENTOR(S) : Lee et al.

It is certified that error appears in the above-identified patent and that said Letters Patent is hereby corrected as shown below:

At column 7, line 22, replace "IR203=((VVDDO" with -- $I_{R203}=(V_{VDDO}$ --;

At column 9, line 45, replace "R404)//R405" with -- R404)//R405) --; and

At column 9, line 47, replace "5 K))/290 K)" with -- 5 K)//290 K) --.

This certificate supersedes the Certificate of Correction issued October 23, 2007.

Signed and Sealed this

First Day of July, 2008

JON W. DUDAS
*Director of the United States Patent and Trademark Office*